United States Patent
Zhang (10) Patent No.: US 10,032,416 B2
(45) Date of Patent: Jul. 24, 2018

(54) GOA UNIT, GOA CIRCUIT, DISPLAY DRIVING CIRCUIT AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventor: Yuting Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 234 days.

(21) Appl. No.: 15/207,994

(22) Filed: Jul. 12, 2016

(65) Prior Publication Data

US 2017/0116924 A1     Apr. 27, 2017

(30) Foreign Application Priority Data

Oct. 23, 2015   (CN) .......................... 2015 1 0698393

(51) Int. Cl.
   *G11C 19/00*   (2006.01)
   *G09G 3/3266*   (2016.01)
   (Continued)

(52) U.S. Cl.
   CPC ......... *G09G 3/3266* (2013.01); *G09G 3/3233* (2013.01); *G11C 19/28* (2013.01);
   (Continued)

(58) Field of Classification Search
   None
   See application file for complete search history.

(56) References Cited

U.S. PATENT DOCUMENTS

2008/0101529 A1    5/2008   Tobita
2011/0255653 A1*  10/2011   Chae .................... G09G 3/3677
                                                         377/79
(Continued)

FOREIGN PATENT DOCUMENTS

CN          102646401       8/2012
CN          202650493       1/2013
                   (Continued)

OTHER PUBLICATIONS

Office Action from corresponding Chinese Application No. 201510698393.2, Apr. 1, 2017 (5 pages).

*Primary Examiner* — Tuan T Lam
(74) *Attorney, Agent, or Firm* — Harness, Dickey & Pierce, P.L.C.

(57) ABSTRACT

The present disclosure relates to the display technologies, which provides a GOA unit, a GOA circuit, a display driving circuit and a display device, for outputting a gate driving signal and a reset signal of a pixel electrode through a GOA unit, to simplify the display driving circuit. The GOA unit comprises a first node control module, a second node control module, a third node control module, a first output module and a second output module, wherein the first output module outputs the gate driving signal under the control of the node voltage of a first node, the node voltage of a second node and a second input signal inputted at a second input terminal; and the second output module outputs the reset signal of the pixel electrode under the control of the node voltage of the second node, the node voltage of the third node and a third input signal inputted at a third signal input terminal.

20 Claims, 4 Drawing Sheets

(51) Int. Cl.
*G09G 3/3233* (2016.01)
*G11C 19/28* (2006.01)
*G09G 3/36* (2006.01)

(52) U.S. Cl.
CPC ... *G09G 3/3677* (2013.01); *G09G 2300/0842* (2013.01); *G09G 2310/0262* (2013.01); *G09G 2310/0286* (2013.01); *G09G 2310/08* (2013.01)

(56) References Cited

U.S. PATENT DOCUMENTS

| | | |
|---|---|---|
| 2012/0133574 A1 | 5/2012 | Wu et al. |
| 2014/0062846 A1 | 3/2014 | Cao |
| 2014/0160000 A1* | 6/2014 | Ma .......................... G11C 19/28 345/100 |
| 2016/0012911 A1* | 1/2016 | Han ........................ G09G 3/20 377/64 |
| 2016/0019833 A1 | 1/2016 | Wei et al. |
| 2016/0055814 A1* | 2/2016 | Yang .................... G09G 3/3677 345/213 |
| 2016/0224183 A1 | 8/2016 | Nie et al. |
| 2016/0253975 A1* | 9/2016 | Yang ....................... G11C 19/28 345/58 |
| 2016/0351159 A1* | 12/2016 | Yang ........................ G09G 3/20 |
| 2016/0358666 A1* | 12/2016 | Pang ..................... G11C 19/287 |
| 2017/0004775 A1 | 1/2017 | Chen et al. |
| 2017/0018241 A1* | 1/2017 | Park ....................... G09G 3/3677 |
| 2017/0039950 A1* | 2/2017 | Li ........................ G09G 3/3266 |
| 2017/0069286 A1* | 3/2017 | Wu ......................... G09G 3/20 |
| 2017/0140707 A1 | 5/2017 | Xu et al. |

FOREIGN PATENT DOCUMENTS

| | | |
|---|---|---|
| CN | 103440847 | 12/2013 |
| CN | 104157236 | 11/2014 |
| CN | 104715726 | 6/2015 |
| CN | 104900192 | 9/2015 |
| EP | 2713361 | 4/2014 |
| JP | 2008108374 | 5/2008 |

* cited by examiner

GOA UNIT, GOA CIRCUIT, DISPLAY DRIVING CIRCUIT AND DISPLAY DEVICE

CROSS-REFERENCE TO RELATED APPLICATION

This application claims the benefit and priority of Chinese Patent Application No. 201510698393.2 filed Oct. 23, 2015. The entire disclosure of the above application is incorporated herein by reference.

FIELD

The present disclosure relates to display technologies, and more particularly, to a Gate driver On Array (i.e. GOA) unit, a GOA circuit, a display driving circuit and a display device.

BACKGROUND

This section provides background information related to the present disclosure which is not necessarily prior art.

Organic Light-Emitting Diode (i.e. OLED) display is one of hotspots in today's flat panel display research field. Compared with conventional Liquid Crystal Display (i.e. LCD), OLED display has advantages like low power consumption, low production cost, self-luminance, wide viewing angle and fast response, etc. Currently, OLED displays have begun to replace conventional liquid crystal displays on mobile phone, PDA, digital camera and other devices.

GOA circuit design of OLED has always been the core issue of those skilled in the art during continuous research. Typically it is required to provide a gate driving signal and a reset signal of a pixel electrode in the OLED driving process. In prior art, the driving of OLED is implemented by designing a gate drive circuit providing a gate driving signal and a reset circuit providing a reset signal of a pixel electrode, respectively. However, such design of generating the gate driving signal and the reset signal of pixel electrode through two circuits respectively will increase the difficulty of manufacturing the display driving circuit.

SUMMARY

This section provides a general summary of the disclosure, and is not a comprehensive disclosure of its full scope or all of its features.

Embodiments of the present disclosure provide a GOA unit, a GOA circuit, a display driving circuit and a display device, for outputting a gate driving signal and a reset signal of a pixel electrode through a GOA unit to simplify the display driving circuit.

According to an embodiment of the present disclosure, there is provided a GOA unit, including a first node control module, a second node control module, a third node control module, a first output module and a second output module. The first node control module is connected to a first signal input terminal, a second signal input terminal, a first node, a second node and a first level terminal, respectively, and is configured to make the node voltage of the first node equal to either the voltage of a first input signal inputted at the first signal input terminal or the voltage of the first level terminal, under the control of the first input signal, a second input signal inputted at the second signal input terminal and the node voltage of the second node. The second node control module is connected to a first clock signal terminal, the first node, the second node and the first level terminal, respectively, and is configured to make the node voltage of the second node equal to either the voltage of a first clock signal inputted at the first clock signal terminal or the voltage of the first level terminal, under the control of the first clock signal and the node voltage of the first node. The third node control module is connected to the first signal input terminal, a third signal input terminal, a third node and the first level terminal, respectively, and is configured to make the node voltage of the third node equal to either the voltage of the first input signal inputted at the first signal input terminal or the voltage of the first level terminal, under the control of the first input signal and a third input signal inputted at the third signal input terminal. The first output module is connected to a second clock signal terminal, the first node, the second node, the second signal input terminal, the first level terminal and a first signal output terminal, respectively, and is configured to output at the first signal output terminal a second clock signal inputted at the second clock signal terminal or make the voltage of a first output signal at the first signal output terminal equal to the voltage of the first level terminal, under the control of the node voltage of the first node, the node voltage of the second node and the second input signal. The second output module is connected to the second clock signal terminal, the second node, the third node, the third signal input terminal, a second signal output terminal and the first level terminal, respectively, and is configured to output at the second signal output terminal the second clock signal inputted at the second clock signal terminal or make the voltage of a second output signal at the second signal output terminal equal to the voltage of the first level terminal, under the control of the node voltage of the second node, the node voltage of the third node and the third input signal.

In an embodiment of the present disclosure, the first node control module may further comprise a first switching element, a second switching element and a third switching element. A first electrode and a control electrode of the first switching element are coupled to the first signal input terminal, and a second electrode of the first switching element is coupled to the first node. A first electrode of the second switching element is coupled to the first node, a second electrode of the second switching element is coupled to the first level terminal, and a control electrode of the second switching element is coupled to the second signal input terminal. A first electrode of the third switching element is coupled to the first node, a second electrode of the third switching element is coupled to the first level terminal, and a control electrode of the third switching element is coupled to the second node.

In an embodiment of the present disclosure, the second node control module may further comprise a fourth switching element, a fifth switching element and a sixth switching element. A first electrode of the fourth switching element is coupled to the first clock signal terminal, a second electrode of the fourth switching element is coupled to the second node, and a control electrode of the fourth switching element is coupled to a second electrode of the sixth switching element. A first electrode of the fifth switching element is coupled to the first node, a second electrode of the fifth switching element is coupled to the first level terminal, and a control electrode of the fifth switching element is coupled to the first node. A first electrode of the sixth switching element is coupled to the first clock signal terminal, and a control electrode of the sixth switching element is coupled to the first clock signal terminal.

In an embodiment of the present disclosure, the third node control module may further comprise a seventh switching element and an eighth switching element. A first electrode of the seventh switching element is coupled to the first signal input terminal, a second electrode of the seventh switching element is coupled to the third node, and a control electrode of the seventh switching element is coupled to the first signal input terminal. A first electrode of the eighth switching element is coupled to the third node, a second electrode of the eighth switching element is coupled to the first level terminal, and a control electrode of the eighth switching element is coupled to the third signal input terminal.

In an embodiment of the present disclosure, the first output module may further comprise a ninth switching element, a tenth switching element, an eleventh switching element and a first energy storage element. A first electrode of the first energy storage element is coupled to the first node, and a second electrode of the first energy storage element is coupled to the first signal output terminal. A first electrode of the ninth switching element is coupled to the second clock signal terminal, a second electrode of the ninth switching element is coupled to the first signal output terminal, and a control electrode of the ninth switching element is coupled to the first node. A first electrode of the tenth switching element is coupled to the first signal output terminal, a second electrode of the tenth switching element is coupled to the first level terminal, and a control electrode of the tenth switching element is coupled to the second node. A first electrode of the eleventh switching element is coupled to the first signal output terminal, a second electrode of the eleventh switching element is coupled to the first level terminal, and a control electrode of the eleventh switching element is coupled to the second signal input terminal.

In an embodiment of the present disclosure, the second output module may further comprise a twelfth switching element, a thirteenth switching element, a fourteenth switching element and a second energy storage element. A first electrode of the second energy storage element is coupled to the third node, and a second electrode of the second energy storage element is coupled to the second signal output terminal. A first electrode of the twelfth switching element is coupled to the second clock signal terminal, a second electrode of the twelfth switching element is coupled to the second signal output terminal, and a control electrode of the twelfth switching element is coupled to the third node. A first electrode of the thirteenth switching element is coupled to the second signal output terminal, a second electrode of the thirteenth switching element is coupled to the first level terminal, and a control electrode of the thirteenth switching element is coupled to the second node. A first electrode of the fourteenth switching element is coupled to the second signal output terminal, a second electrode of the fourteenth switching element is coupled to the first level terminal, and a gate of the fourteenth switching element is coupled to the third signal input terminal.

In a further embodiment of the present disclosure, each of the switching elements may be a FET (Field Effect Transistor) or a Bipolar Transistor, and the first and second energy storage elements are capacitors.

In a further embodiment of the present disclosure, the first clock signal and the second clock signal may have the same clock cycle and amplitude but opposite phases, and the first clock signal and the second clock signal both have a duty cycle of 50%.

According to an embodiment of the present disclosure, there is provided a GOA circuit including a plurality of cascaded GOA units above-mentioned. A first frame start signal is inputted to the first signal input terminal of a first-stage GOA unit, a second frame start signal is inputted to the first signal input terminal of a second-stage GOA unit, and a third frame start signal is inputted to the first signal input terminal of a third-stage GOA unit, the first signal output terminal of a Nth-stage GOA unit is coupled to the first signal input terminal of a (N+3)th-stage GOA unit, the third signal input terminal of a (N−1)th-stage GOA unit, the second signal input terminal of (N−3)th-stage GOA unit and a gate driving signal terminal of the Nth row of pixel units corresponding to the Nth-stage GOA unit, respectively; and the second signal output terminal of the Nth-stage GOA unit is coupled to a reset signal terminal of the Nth row of pixel units corresponding to the Nth-stage GOA unit, wherein, N is a natural number.

In a further embodiment of the present disclosure, the first clock signal and the second clock signal of each stage GOA unit may have the same clock cycle and amplitude but opposite phases. The first clock signal and the second clock signal of the Nth-stage GOA unit are identical with the second clock signal and the first clock signal of the (N+3)th-stage GOA unit respectively; the first clock signal of the second-stage GOA unit lags behind the first clock signal of the first-stage GOA unit by ⅙ clock period in phase, and the first clock signal of the third-stage GOA unit lags behind the first clock signal of the first-stage GOA unit by ⅓ clock period in phase.

According to an embodiment of the present disclosure, there is provided a display driving circuit of the present disclosure including the GOA circuit above-mentioned and a pixel driving circuit.

In a further embodiment of the present disclosure, the pixel driving circuit in the display driving circuit may be provided with a data signal terminal, a gate driving signal terminal, a reset signal terminal, a high level signal terminal and a low level signal terminal. The gate driving signal terminal of the Nth row of pixel units is coupled to the first signal output terminal of the Nth stage GOA unit in the GOA circuit, and the reset signal terminal of the Nth row of pixel units is coupled to the second signal output terminal of the Nth-stage GOA unit in the GOA circuit.

In a further embodiment of the present disclosure, the pixel driving circuit in the display driving circuit may include a fifteenth switching element, a sixteenth driving element, a seventeenth switching element, a third energy storage element, a fourth energy storage element and an OLED. A first electrode of the fifteenth switching element is coupled to a data signal terminal, a second electrode of the fifteenth switching element is coupled to a first electrode of the third element storage element, and a control electrode of the fifteenth switching element is coupled to the gate driving signal terminal. A first electrode of the sixteenth driving element is coupled to the high level signal terminal, and a second electrode of the sixteenth driving element is coupled to a second electrode of the third energy storage element. A first electrode of the seventeenth switching element is coupled to the low level signal terminal, a second electrode of the seventeenth switching element is coupled to a first electrode of the fourth energy storage element, and a control element of the seventeenth switch is coupled to the reset signal terminal. An anode of the OLED is coupled to the second electrode of the sixteenth driving element, and a cathode of the OLED is grounded. A second electrode of the fourth energy storage element is grounded.

According to an embodiment of the present disclosure, there is provided a display device comprising the display driving circuit above-mentioned.

In a further embodiment of the present disclosure, the pixel driving circuit in the display device may include a fifteenth switching element, a sixteenth driving element, a seventeenth switching element, a third energy storage element, a fourth energy storage element and an OLED. A first electrode of the fifteenth switching element is coupled to a data signal terminal, a second electrode of the fifteenth switching element is coupled to a first electrode of the third element storage element, and a control electrode of the fifteenth switching element is coupled to the gate driving signal terminal. A first electrode of the sixteenth driving element is coupled to the high level signal terminal, and a second electrode of the sixteenth driving element is coupled to a second electrode of the third energy storage element. A first electrode of the seventeenth switching element is coupled to the low level signal terminal, a second electrode of the seventeenth switching element is coupled to a first electrode of the fourth energy storage element, and a control element of the seventeenth switch is coupled to the reset signal terminal. An anode of the OLED is coupled to the second electrode of the sixteenth driving element, and a cathode of the OLED is grounded. A second electrode of the fourth energy storage element is grounded. The gate driving signal terminal of the Nth row of pixel units is coupled to the first signal output terminal of the Nth-stage GOA unit in the GOA circuit, and the reset signal terminal of the Nth row of pixel units is coupled to the second signal output terminal of the Nth-stage GOA unit in the GOA circuit.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Example embodiments will now be described more fully with reference to the accompanying drawings.

Those skilled in the art would appreciate that the terms used herein are only for the purpose of describing particular embodiments and are not intended to limit the disclosure. As used herein, the singular forms "a", "an" and "the" are intended to comprise the plural forms as well, unless expressly stated in other cases. It should be further understood that when the terms "include", "comprise", "including" and/or "comprising" are used in this specification, they refer to the elements, parts, modules and/or units that exist but do not exclude the presence or addition of one or more other elements, parts, modules and/or combinations thereof.

Unless otherwise defined, all terms (comprising technical and scientific terms) used herein have the same meaning commonly understood by those skilled in the art where the disclosed subject matter belongs. It will be further understood that terms, such as those defined in commonly used dictionaries, should be interpreted as the meanings consistent with their meanings in the context of the description and the related art, and will not be explained in an idealized or overly formal form, unless otherwise explicitly defined herein. As used herein, the statement "connecting" or "coupling" two or more parts together shall mean that the parts are directly combined together or combined through one or more intermediate components.

In all embodiments of the present disclosure, the switching elements and the driving elements employed are illustrated by example of N-type (MOS) Field Effect Transistor (FET), and also may adopt P-type FETs, and P-type or N-type Bipolar Transistors to implement the functions of the switching elements and the driving elements. Since source and drain of a transistor (emitter and collector) are symmetrical, and a P-type transistor and a N-type transistor have opposite directions of conduction current between source and drain (emitter and collector), in the embodiments of the present disclosure, it is specified that a controlled intermediate terminal of a transistor is the gate, a signal input terminal is the source, and a signal output terminal is the drain. Further, any controlled switching device with gating signal input may be adopted to implement the functions of the switching elements, the controlled intermediate terminal of the switching device for receiving a control signal (for example, for turning on and off the controlled switching device) being called a control electrode, the signal input terminal being called the first electrode, and the signal output terminal being called the second electrode. The transistors employed in the embodiments of the present disclosure are primarily switching transistors and driving transistors. Further, the capacitor employed in the embodiment of the present disclosure also may adopt an energy storage element having a similar function.

The display device according to the present disclosure includes a display driving circuit. The display driving circuit includes a gate driving circuit and a pixel driving circuit.

Figure 1:
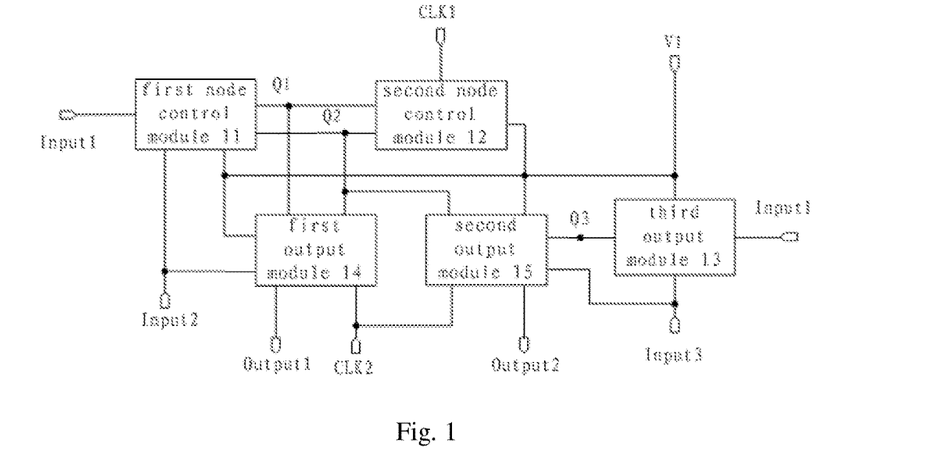
FIG. 1 is an exemplary block diagram of a GOA unit according to an embodiment of the present disclosure.

FIG. 1 shows an exemplary block diagram of a GOA unit in a gate driving circuit (GOA circuit) according to an embodiment of the present disclosure. Functionally, a GOA unit comprises a first node control module 11, a second node control module 12, a third node control module 13, a first output module 14 and a second output module 15.

The first node control module 11 is connected to a first signal input terminal, a second signal input terminal, a first node Q1, a second node Q2 and a first level terminal V1, respectively, and is configured to make the node voltage of the first node Q1 equal to either the voltage of a first input signal Input1 inputted at the first signal input terminal or the voltage of the first level terminal V1, under the control of the first input signal Input1, a second input signal Input2 inputted at the second signal input terminal and the node voltage of the second node Q2.

The second node control module 12 is connected to a first clock signal terminal, the first node Q1, the second node Q2 and the first level terminal V1, respectively, and is configured to make the node voltage of the second node Q2 equal to either the voltage of a first clock signal CLK1 inputted at the first clock signal terminal or the voltage of the first level terminal V1, under the control of the first clock signal CLK1 and the node voltage of the first node Q1.

The third node control module 13 is connected to the first signal input terminal, a third signal input terminal, a third node Q3 and the first level terminal V1, respectively, and is configured to make the node voltage of the third node Q3 equal to either the voltage of the first input signal Input1 inputted at the first signal input terminal or the voltage of the first level terminal V1, under the control of the first input signal Input1 and a third input signal Input3 inputted at the third signal input terminal.

The first output module 14 is connected to a second clock signal terminal CLK2, the first node Q1, the second node Q2, the second signal input terminal, the first level terminal V1 and a first signal output terminal, respectively, and is configured to output at the first signal output terminal a second clock signal CLK2 inputted at the second clock signal terminal or make the voltage of a first output signal Output1 at the first signal output terminal equal to the voltage of the first level terminal V1, under the control of the node voltage of the first node Q1, the node voltage of the second node Q2 and the second input signal Input2.

The second output module 15 is connected to the second clock signal terminal, the second node Q2, the third node Q3, the third signal input terminal, a second signal output terminal and the first level terminal V1, respectively, and is configured to output at the second signal output terminal the second clock signal CLK2 inputted at the second clock signal terminal or make the voltage of a second output signal Output2 at the second signal output terminal equal to the voltage of the first level terminal V1, under the control of the node voltage of the second node Q2, the node voltage of the third node Q3 and the third input signal Input3.

Since the first output module of the GOA unit may output the first output signal under the control of the node voltages of the first node and the second node, and the second output module may output the second output signal under the control of the node voltages of the second node and the third node, the present embodiment of the disclose may output the two output signals respectively via one GOA unit and take the two output signals as the reset signal of the pixel electrodes and the gate driving signal. Compared to the prior art, providing a reset signal of pixel electrode and a gate driving signal via two circuits respectively, this approach may simplify the structure of the display driving circuit.

Figure 2:
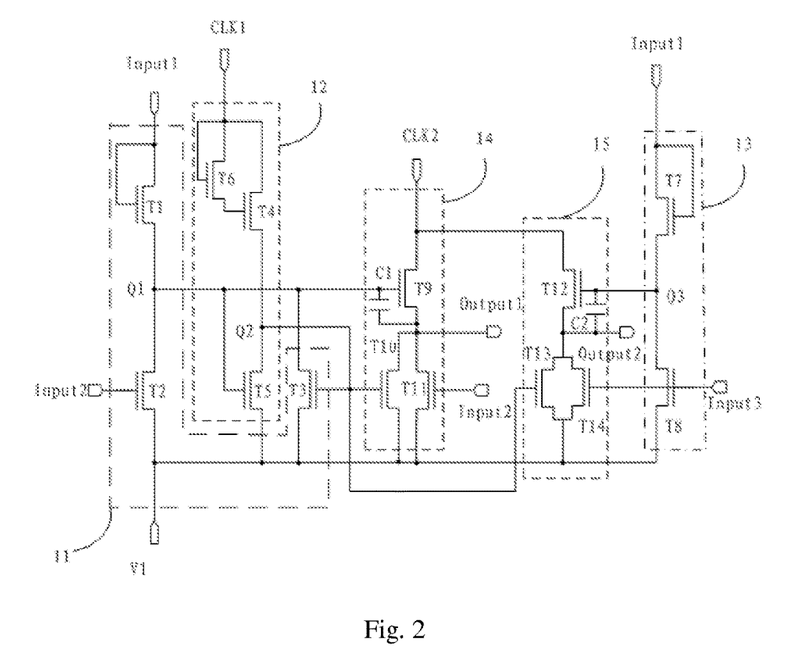
FIG. 2 is an exemplary circuit of a GOA unit according to the embodiment of the present disclosure.

Further, FIG. 2 shows an exemplary circuit diagram of a GOA unit of a display driving circuit of a display device according to the embodiment of the present disclosure.

In an aspect, the first node control module 11 includes a first switching element T1, a second switching element T2 and a third switching element T3. A first electrode and a control electrode of the first switching element T1 are coupled together to the first signal input terminal, and a second electrode of the first switching element T1 is coupled to the first node Q1. A first electrode of the second switching element T2 is coupled to the first node Q1, a second electrode of the second switching element T2 is coupled to the first level terminal V1, and a control electrode of the second switching element T2 is coupled to the second signal input terminal. A first electrode of the third switching element T3 is coupled to the first node Q1, a second electrode of the third switching element is coupled to the first level terminal V1, and a control electrode of the third switching element T3 is coupled to the second node Q2.

The second node control module 12 comprises a fourth switching element T4, a fifth switching element T5 and a sixth switching element T6. A first electrode of the fourth switching element T4 is coupled to the first clock signal terminal, a second electrode of the fourth switching element T4 is coupled to the second node Q2, and a control electrode of the fourth switching element T4 is coupled to a second electrode of the sixth switching element T6. A first electrode of the fifth switching element T5 is coupled to the first node Q1, a second electrode of the fifth switching element T5 is coupled to the first level terminal V1, and a control electrode of the fifth switching element T5 is coupled to the first node Q1. A first electrode of the sixth switching element T6 is coupled to the first clock signal terminal, and a control electrode of the sixth switching element T6 is coupled to the first clock signal terminal.

The third node control module 13 comprises a seventh switching element T7 and an eighth switching element T8. A first electrode of the seventh switching element T7 is coupled to the first signal input terminal, a second electrode of the seventh switching element T7 is coupled to the third node Q3, and a control electrode of the seventh switching element T7 is coupled to the first signal input terminal. A first electrode of the eighth switching element T8 is coupled to the third node Q3, a second electrode of the eighth switching element T8 is coupled to the first level terminal V1, and a control electrode of the eighth switching element T8 is coupled to the third signal input terminal.

The first output module 14 comprises a ninth switching element T9, a tenth switching element T10, an eleventh switching element T11 and a first capacitor C1. A first electrode of the first capacitor C1 is coupled to the first node Q1, a second electrode of the first capacitor C1 is coupled to the first signal output terminal. A first electrode of the ninth switching element T9 is coupled to the second clock signal terminal, a second electrode of the ninth switching element T9 is coupled to the first signal output terminal, and a control electrode of the ninth switching element T9 is coupled to the first node Q1. A first electrode of the tenth switching element T10 is coupled to the first signal output terminal T10, a second electrode of the tenth switching element T10 is coupled to the first level terminal V1, and a control electrode of the tenth switching element is coupled to the second node Q2. A first electrode of the eleventh switching element T11 is coupled to the first signal output terminal, a second electrode of the eleventh switching element T11 is coupled to the first level terminal V1, and a control electrode of the eleventh switching element T11 is coupled to the second signal input terminal.

The second output module 15 comprises a twelfth switching element T12, a thirteenth switching element T13, a fourteenth switching element T14 and a second capacitor C2. A first electrode of the second capacitor C2 is coupled to the third node Q3, and a second electrode of the second capacitor C2 is coupled to the second signal output terminal. A first electrode of the twelfth switching element T12 is coupled to the second clock signal terminal CLK2, a second electrode of the twelfth switching element T12 is coupled to the second signal output terminal, and a control electrode of the twelfth switching element T12 is coupled to the third node Q3. A first electrode of the thirteenth switching element T13 is coupled to the second signal output terminal, a second electrode of the thirteenth switching element T13 is coupled to the first level terminal V1, and a control electrode of the thirteenth switching element T13 is coupled to the second node Q2. A first electrode of the fourteenth switching element T14 is coupled to the second signal output terminal, a second electrode of the fourteenth switching element T14 is coupled to the first level terminal V1, and a control electrode of the fourteenth switching element T14 is coupled to the third signal input terminal.

Now, in conjunction with FIG. 3 which shows a timing chart of respective signals in the GOA unit according to the embodiment of the present disclosure, the operation of the GOA unit will be described.

Figure 3:
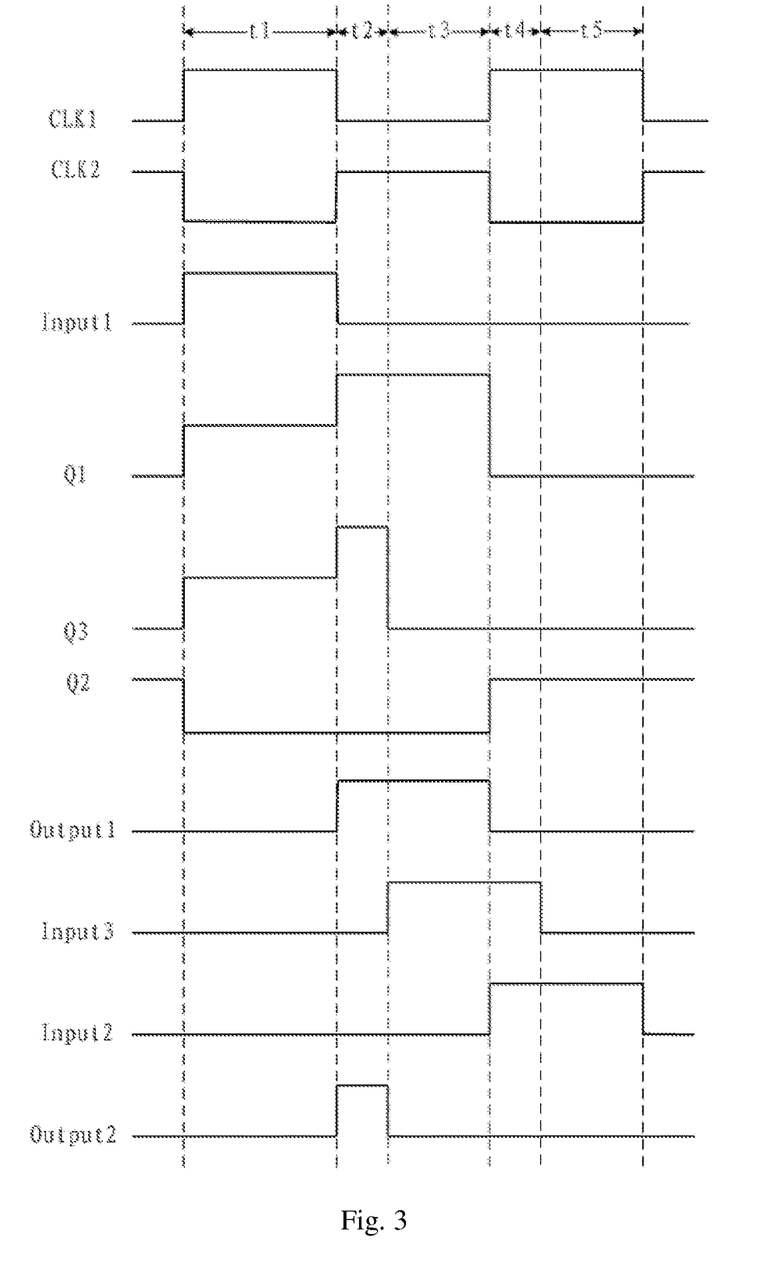
FIG. 3 is a timing chart of the signals in a GOA unit according to the embodiment of the present disclosure.

In FIG. 3, it shows the timing sequences of the first clock signal CLK1, the second clock signal CLK2, the first input signal Input1, the second input signal Input2, the third input signal Input3, the first output signal Output1, the second output signal Output2, the node voltage of the first node Q1, the node voltage of the second node Q2 and the node voltage of the third node Q3.

The first level terminal V1 is at low level VGL (not shown). For example, the first level terminal V1 may be grounded. FIG. 3 illustrates the timing sequences of five stages, namely, a first stage t1, a second stage t2, a third stage t3, a fourth stage t4 and a fifth stage t5.

In the first stage t1, the CLK1 and Input1 signals are at high levels, CLK2, Input2 and Input3 signals are at low levels. Since Input1 is at high level, T1 and T7 are turned on, and Input1 signal charges the first electrode of C1 through T1. Since Input2 is at low level, T2 is turned off, voltage of Q1 rises, and T5 is turned on. Similarly, Input1 signal charges the first electrode of C2 through T7, and since Input3 is at low level, T8 is turned off, voltage of Q3 rises, whereby T12 is turned on. In addition, at this stage, since CLK1 is at high level, T6 and T4 are turned on. Since Q1 is at high level, T5 is turned on, so that Q2 and V1 have the same voltage and both are at low level. CLK2 is at low level, Q1 and Q3 are at high level, so that T9 and T12 are turned on, and Output1 and Output2 have the same voltage as CLK2 and are at low level. It need to be noted that, although CLK1 and Input1 output high level signals simultaneously, since Q1 is coupled with Input1 through the switching element T1, while Q2 is coupled to CLK1 through the two switching elements T4, T6, and each switching element has a parasitic capacitance, whereby voltage of Q1 rises before Q2, thereby ensuring that T5 is turned on and T3 is turned off at this stage, so Q1 is at high level and Q2 is at low level.

In the second stage t2, CLK2 is at high level, CLK1, Input1, Input2 and Input3 are at low levels. In this stage, CLK1 is at low level, T6, T4 are turned off, and since Q2 is at low level, T3 is also turned off. Since Input1 is at low level, T1, T7 are turned off, whereby the first electrode of C1 floats, CLK2 inputs a high level signal to charge the second electrode of C1, the voltage of the first electrode of C1 has an equipotential jump, so that Q1 voltage further rises. Because T9 is turned on, Output1 is coupled with CLK2 through T9, such that Output1 outputs the second clock signal CLK2. Since T7 is off, the first electrode of C2 floats, CLK2 inputs a high level signal through T12 to charge the second electrode of C2, voltage of the first electrode of C2 has an equipotential jump, so that Q3 voltage further rises. Because T12 is turned on, Output2 is coupled to CLK2 through T12, so that Output2 outputs the second clock signal CLK2.

In the third stage t3, CLK2 and Input3 are at high levels, CLK1, and Input1 and Input2 are at low levels. Because Input3 is at high level, T8 is turned on. Q3 is coupled to V1 through T8, and Q3 becomes at low level, so that T12 is turned off, Output2 stops outputting the second clock signal CLK2. In addition, since Input3 is at high level, T14 is turned on, and Output2 is coupled to V1 through T14, thus discharges C2 and outputs a low level signal. The timing sequence of the control signals of Q1 is constant, so Q1 still remains at high level, and the timing sequence of the control signals of Q2 is constant, so Q2 still remains at low level. CLK2 is still at high level, so in this stage Output1 continues to output the second clock signal CLK2.

In the fourth stage t4, CLK1, Input2 and Input3 are at high levels, while CLK2 and Input1 are at low level. In this stage, Input2 is at high level, so T2 and T11 are turned on, Q1 is coupled to V1 through T2, then Q1 becomes at low level, whereby T5 is turned off. Output1 is coupled to V1 through T11, so as to discharge C1. CLK1 becomes a high level signal, T6 and T4 are turned on, and T5 is turned off, so the voltage of Q2 becomes at high level, so that T3, T10 and T13 are turned on. Q1 is coupled to V1 through T3, to further discharge C1. Output1 is coupled to V1 through T10, and outputs a low level signal. Output2 is coupled to V1 through T13, and also outputs a low level signal.

In the fifth stage t5, CLK1 and Input2 are at high levels, and CLK2, Input1 and Input3 are at low level. In this stage, CLK1 is at high level, T6 and T4 are turned on. Input2 is at high level, T2 and T11 are turned on, so Q1 is at low level, Q2 is at high level, so that T10 and T13 are turned on, then Output1 is coupled to V1 through T10, remains at low level, and Output2 is coupled to V1 through T13, and remains at low level.

Here, starting from first stage t1 until a high level signal is inputted to Input1 of the GOA unit is a complete work cycle of the GOA unit, that is, after the fifth stage t5, one work cycle of the GOA unit may also include a number of other stages, which is decided by the number of rows scanned by the GOA circuit. However, after the fifth stage t5, until a high level signal is inputted to Input1 of the GOA unit again, Output1 and Output2 of the GOA unit will remain at low level.

Further, all the switching elements in the GOA unit in the above embodiments may also be P-type FETs which is turned on by low level signal. If all the switching elements are P-type FETs, it is only needed to re-adjust and invert the direction of the timing state of each input signal. For example, the first level terminal V1 is adjusted to provide a high level signal, the first clock signal CLK1 in the first stage t1 in FIG. 3 is adjusted to be at low level, the second clock signal CLK2 in the first stage t1 is adjusted to be at high level, and other input signals are adjusted to timing sequence signals with opposite phase correspondingly.

Still further, the above-described GOA units may also adopt N-type FETs and P-type FETs simultaneously, and in this way it needs to be guaranteed that the switching elements in the GOA circuit, controlled by the same timing signal or voltage, need to use the same FET type. Some or all of the FETs in the GOA unit may be replaced with corresponding N-type or P-type BJTs. Taking into account the manufacturing process for FETs or transistors, since doped materials of active layer of different type of FET or transistor are not the same, adopting the same type of FET or transistor in the GOA circuit is more conducive to simplify the manufacturing process for the GOA circuit.

Figure 4:
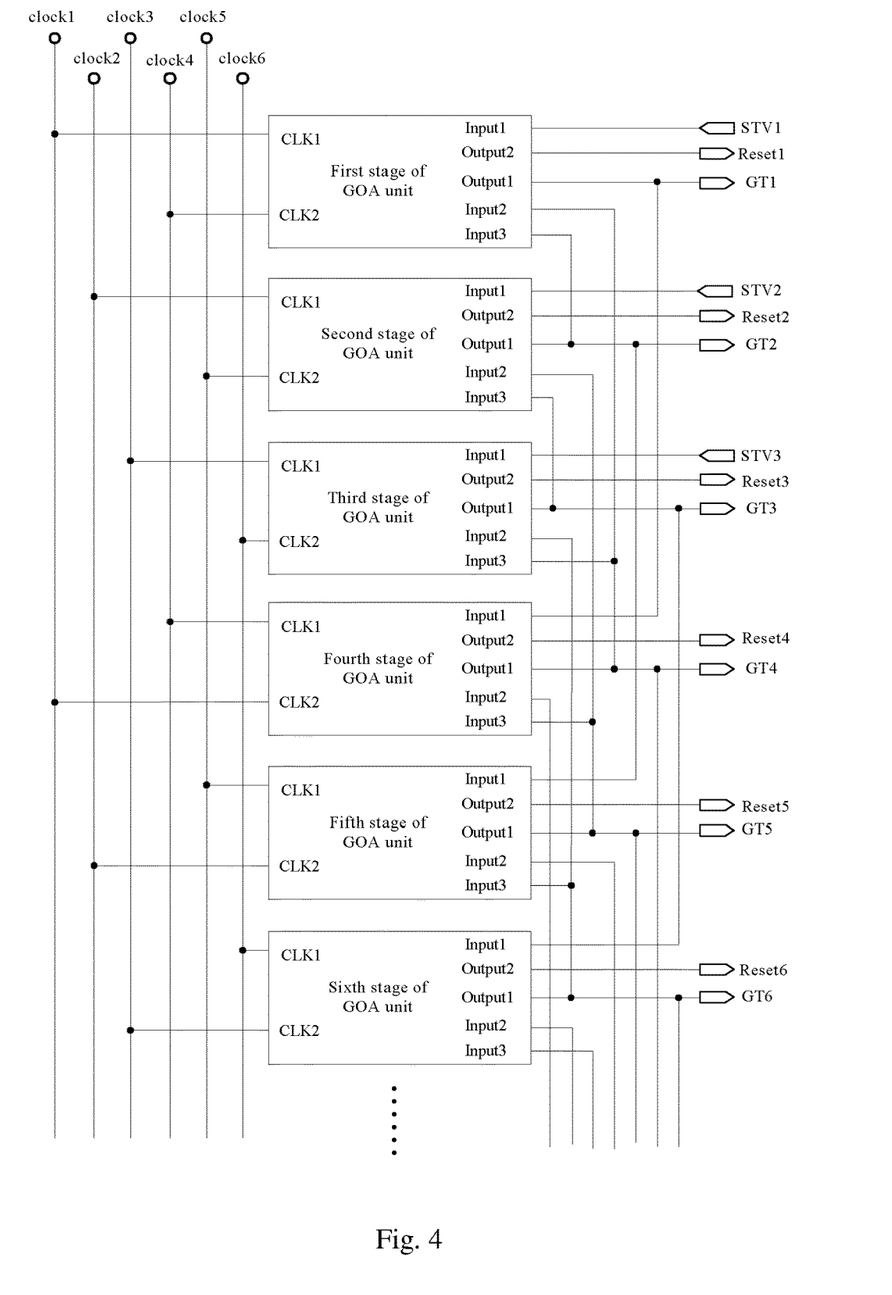
FIG. 4 is an exemplary block diagram of a GOA circuit according to another embodiment of the present disclosure.

FIG. 4 shows an exemplary block diagram of a cascaded GOA circuit according to an embodiment of the present disclosure. In the embodiment, the cascaded GOA circuit may include a plurality of the cascaded GOA units according to any of the embodiments above-described.

Each stage GOA unit is configured to drive a pixel unit in a corresponding row. A first signal output terminal of each stage GOA unit outputs a first output signal Output1 for driving a pixel unit in a corresponding row, namely a gate driving signal GT. A second signal output terminal Output2 of each stage GOA unit outputs a reset signal Reset for resetting a pixel unit in a corresponding row.

For the cascade of a number of GOA units, a first frame start signal STV1 is inputted to the first signal input terminal Input1 of a first-stage GOA unit, a second frame start signal STV2 is inputted to the first signal input terminal Input1 of a second-stage GOA unit, and a third frame start signal STV3 is inputted to the first signal input terminal Input1 of a third-stage GOA unit, the first signal output terminal Output1 of the Nth-stage GOA unit is coupled to the first signal input terminal Input1 of the (N+3)th-stage GOA unit, the third signal input terminal Input3 of the last stage GOA unit, namely, a (N−1)th-stage GOA unit, the second signal input terminal Input2 of the (N−3)th-stage GOA unit and a gate driving signal terminal GTn of the Nth row of pixel units, respectively. The second signal output terminal Output2 of the Nth-stage GOA unit is coupled to the reset signal terminal ResetN of the Nth row of pixel units. Herein, N is a natural number.

Specifically, for the first stage GOA unit, the first signal input terminal Input1 is coupled to the first frame start signal STV1, the second signal input terminal Input2 is coupled to the first signal output terminal Output1 of the fourth stage GOA unit, the signal input terminal Input3 is coupled to the first signal output terminal Output1 of the second stage GOA unit, the first signal output terminal Output1 is coupled to the first signal input terminal Input1 of the fourth stage GOA unit and to the gate driving signal input terminal GT1 of the first row of pixel unit, the second signal output terminal is coupled to the reset signal terminal Reset1 of the first row of pixel unit.

For the second stage GOA unit, the first signal input terminal Input1 is coupled to the second frame start signal STV2, the second signal input terminal Input2 is coupled to the first signal output terminal Output1 of a fifth stage GOA unit, the third signal input terminal Input3 is coupled to the first signal output terminal Output1 of the third stage GOA unit, the first signal output terminal Output1 is coupled to the first signal input terminal Input1 of the fifth stage GOA unit and to the gate driving signal input terminal GT2 of the second row of pixel unit, the second signal output terminal is coupled to the reset signal terminal Reset2 of a second row of pixel unit.

For the third stage GOA unit, the first signal input terminal Input1 is coupled to the third frame start signal STV3, the second signal input terminal Input2 is coupled to the first signal output terminal Output1 of the sixth stage GOA unit, the third signal input terminal Input3 is coupled to the first signal output terminal Output1 of the fourth stage GOA unit, the first signal output terminal Output1 is coupled to the first signal input terminal Input1 of the sixth stage GOA unit and to the gate driving signal input terminal GT3 of the third row of pixel unit, the second signal output terminal is coupled to the reset signal terminal Reset3 of the third row of pixel unit.

For the fourth stage GOA unit, the first signal input Input1 is coupled to the first signal output terminal Output1 of the first stage GOA unit, the second signal input Input2 is coupled to the first signal output terminal Output1 of a seventh stage GOA unit, the third signal input terminal Input3 is coupled to the first signal output terminal Output1 of the fifth stage GOA unit, the first signal output terminal Output1 is coupled to the first signal input terminal Input1 of the seventh stage GOA unit and to the gate driving signal input terminal GT4 of the fourth row of pixel unit, the second signal output terminal is coupled to the reset signal terminal Reset4 of the fourth row of pixel unit.

The manner of cascading the other GOA unit in the cascaded GOA circuit is similar and will not be repeated again.

For the clock signals in the cascaded GOA circuit, the two clock signal terminals CLK1 and CLK2 of each cascaded GOA unit are provided with the clock signals through six system clock signals clock1, clock2, clock3, clock4, clock5 and clock6 with the same cycle and amplitude. In this way, clock1 is opposite to clock4 in phase, clock2 is opposite to clock5 in phase, clock3 is opposite to clock6 in phase. In an embodiment, clock2 lags behind clock1 by ⅙ clock cycle in phase, clock3 lags behind clock1 by ⅓ clock cycle in phase. All clock signals, clock1, clock2, clock3, clock4, clock5 and clock6, have a duty cycle of 50%. In fact, clock signal, inputted at the first and second clock signals CLK1 and CLK2 of each stage GOA unit, have the same amplitude and cycle but opposite phases.

In addition to that clock1 and clock4 are inputted at the first clock signal CLK1 and the second clock signal CLK2 of the first stage GOA unit respectively, clock2 and clock5 are inputted at the first clock signal CLK1 and the second clock signal CLK2 of the second stage GOA unit respectively, and clock3 and clock6 are inputted at the first clock signal CLK1 and the second clock signal CLK2 of the third stage GOA unit, the first clock signal CLK1 and the second clock signal CLK2 of the Nth stage GOA unit are the same as the second clock signal CLK2 and the first clock signal CLK1 of the (N+3)th-stage GOA unit, respectively.

As for the frame start signals, as shown in FIG. 3, the high level durations of the first frame start signal inputted at the first frame start signal terminal STV1, the second frame start signal inputted at the second frame start signal terminal STV2 and the third frame start signal inputted at the third frame start signal terminal STV3 are ½ clock cycle. Moreover, high level signals are inputted at the first frame start signal and clock1 synchronously, high level signals are inputted at the second frame start signal and clock2 synchronously, and high level signals are inputted at the third frame start signal and clock3 synchronously.

Figure 5:
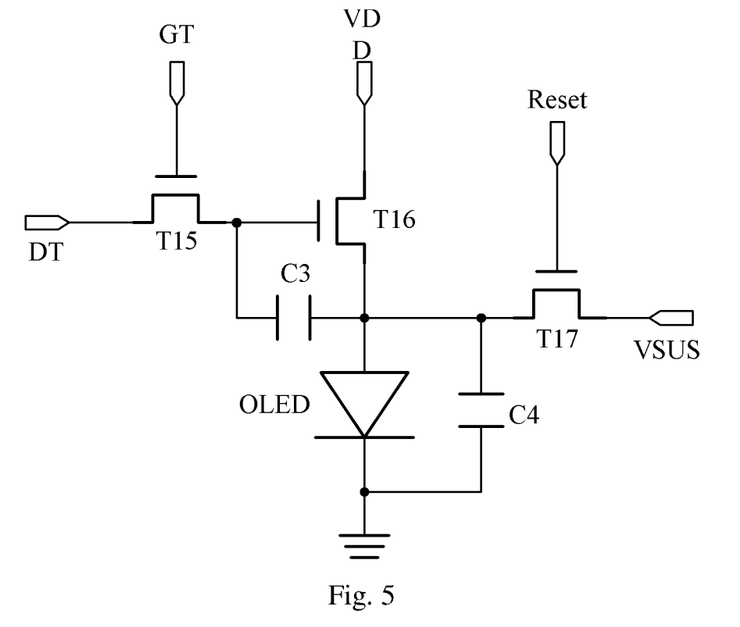
FIG. 5 is an exemplary circuit of a rest circuit of pixel electrode according to an embodiment of the present disclosure.

Further, FIG. 5 shows an exemplary circuit diagram of the pixel driving circuit according to an embodiment of the present disclosure. The pixel driving circuit may include a fifteenth switching element T15, a sixteenth driving element T16, a seventeenth switching element T17, a third capacitor C3, a fourth capacitor C4, and an organic light emitting diode OLED pixel unit.

The first electrode of the fifteenth switching element T15 is coupled to the data signal terminal DT, the second electrode of the fifteenth switching element is coupled to the first electrode of the third capacitor C3, and the control electrode of the fifteenth switching element is coupled to the gate driving signal terminal GT.

The first electrode of the sixteenth driving element T16 (DTFT tube) is coupled to the direct current high level signal terminal VDD, and the second electrode is coupled to the second electrode of the third capacitor C3.

The first electrode of the seventeenth switching element T17 is coupled to the direct current low level signal terminal VSS, the second electrode is coupled to the first electrode of the fourth capacitor C4, and the control element is coupled to the reset signal terminal Reset.

The anode of the organic light emitting diode OLED is coupled to the second electrode of the sixteenth driving element T16, and the cathode of the organic light emitting diode OLED is grounded.

The second electrode of the fourth capacitor C4 is grounded.

In an embodiment, the gate driving signal terminal GT is coupled to the first signal output terminal Output1 of the GOA unit in the cascaded GOA circuit for driving this row of pixel units, and the reset signal terminal Reset is coupled to the second signal output terminal Output2 of the GOA unit in the GOA circuit for driving this row of pixel unit.

Hereinafter, with reference to the schematic timing chart shown in FIG. 6, the work process of the pixel driving circuit shown in FIG. 5 will be described. As an example, the switching elements T15, T17 in FIG. 5 are N-type MOSFET, the driving element T16 is a driving transistor, the direct current low level signal terminal VSS provides a low level signal, and the high level signal terminal VDD provides a high level signal for driving the OLED.

Figure 6:
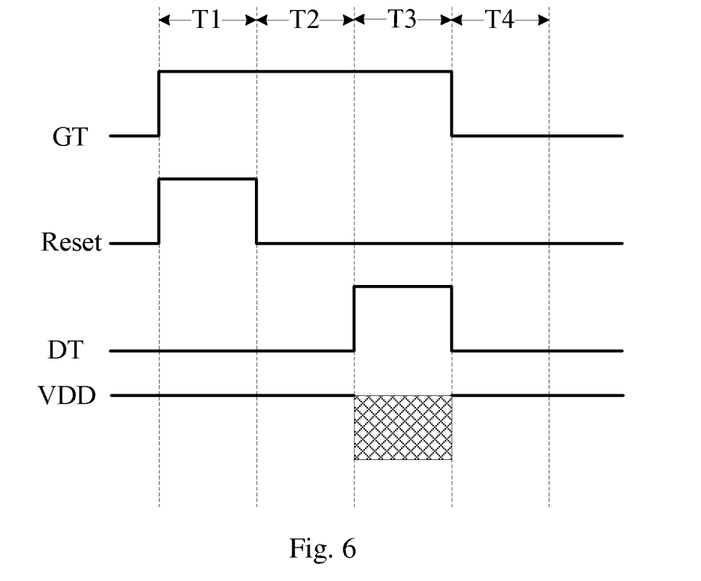
FIG. 6 is a timing chart of the signals in a display driving circuit according to the embodiment of the present disclosure.

According to the timing chart of FIG. 6, it illustrates the gate driving signal of the gate driving signal terminal GT, the reset signal of the reset signal terminal Reset, the high level signal provided by a power source at the high level signal terminal VDD and the data signal inputted at the data signal terminal DT.

The pixel driving procedure may comprise: a first stage T1, a second stage T2, a third stage T3 and a fourth stage T4. In an embodiment, the first stage T1 corresponds to the second stage t2 of the work process of the GOA unit in accordance with the embodiment shown of the present disclosure shown in FIG. 3, the second stage T2 corresponds to the third stage unit t3 of the GOA unit. A high level signal of the high level signal terminal VDD remains high at the stages T1, T2 and T4, and floats at the stage T3.

In the first stage T1 (reset stage), GT, Reset are at high levels, DT is at low level, VDD is at high level. In this stage, GT is at high level, T15 is turned on, Reset is at high level, then the T17 is also turned on, VSS is coupled to the second electrode of the third capacitor C3 through T17, to discharge the third capacitor C3, while VSS is coupled to a first electrode of the fourth capacitor C4 through T17 to discharge the fourth capacitor C4.

In the second stage T2 (threshold acquisition stage), GT is still at high level, Reset and DT are at low levels, VDD remains at high level. Since Reset is at low level, T17 is turned off, VDD charges the capacitor C3 through the driving element T16, and the potential of the second electrode of the charged capacitor C3 is $V_{DD}-V_{th}$, wherein $V_{DD}$ is the voltage value of the high level signal VDD, and $V_{th}$ is the threshold voltage of the driving element T16.

In the third stage T3 (data writing stage), GT remains at high level, DT is at high level, Reset is at low level, and VDD floats. Since GT is at high level, T15 is turned on, DT is coupled to the first electrode of C3 through T15 to charge the first electrode of C3, and the voltage of the first electrode of charged C3 is $V_{dt}$, wherein $V_{dt}$ is the voltage of the data signal terminal DT. Moreover, because VDD floats in this stage, the voltage of the second electrode of C3 is zero.

In the fourth stage T4 (light emitting stage), GT, DT and Reset are at low level, VDD resumes providing a high level signal. Because VDD provides a high level signal, the level of the second electrode of C3 becomes $V_{DD}-V_{th}$. GT is at low level, T15 is turned off, so that the voltage of the first electrode of C3 has an equipotential jump, the voltage becomes $V_{dt}+V_{DD}-V_{th}$, which is a transient state. After the completion of the equipotential transition, the driving transistor T16 is in a saturation state, and the high-level signal terminal VDD outputs a driving current for driving the OLED to emit light.

According to a saturation current formula, the current $I_{OLED}$ flowing into the OLED is calculated by the following formula:

$$I_{OLED} = K(V_{gs} - V_{th})^2$$
$$= K[V_{DD} + V_{dt} - V_{DD} + V_{th} - V_{th}]^2$$
$$= K(V_{dt})^2$$

In an embodiment, $V_{gs}$ is the voltage difference between the gate (the control electrode) and the source (the first electrode) of the DTFT driving element T16, wherein $$K = \mu C_{ox} \frac{W}{L},$$

$\mu$, $C_{ox}$ are process constants, W is as the channel width of the DTFT transistor, L is the channel length of the transistor, W, L are constants of selective designs.

It can be seen from the above equation that the working current $I_{OLED}$ at this time has been not affected by the threshold voltage $V_{th}$ of the DTFT drive transistor, only related with the voltage of the data signal terminal DT, whereby the pixel driving circuit may not be affected by the threshold voltage $V_{th}$ of the DTFT drive transistor T16, and thus can output a stable driving current.

First, the display driving circuit of the display device, according to the above-described embodiments of the present disclosure, outputs a gate driving signal and a reset signal of the pixel electrode through one GOA unit. Compared to the prior art that provides the gate driving signal and the reset signal of the pixel electrode through two circuits respectively, the display driving circuit and the display device according to the embodiments of the present disclosure may simplify the display driving circuit. Furthermore, the display driving circuit provided in the embodiments of the present disclosure may output a stable driving current of the OLED pixel unit without being affected by the threshold voltage of the transistor, whereby the display driving circuit and the display device according to the embodiments of the present disclosure may further increase the display effect of OLED.

The display driving circuit and the display device with the GOA unit and the cascaded GOA circuit as described above may be applied to any product or component with display function, such as an electronic paper, a mobile phone, a tablet computer, a television, a display, a notebook computer, a digital picture frame, a navigator.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A GOA unit comprising a first node control module, a second node control module, a third node control module, a first output module, and a second output module, wherein the first node control module is connected to a first signal input terminal, a second signal input terminal, a first node, a second node and a first level terminal, respectively, and configured to make the node voltage of the first node equal to either the voltage of a first input signal inputted at the first signal input terminal or the voltage of the first level terminal, under the control of the first input signal, a second input signal inputted at the second signal input terminal and the node voltage of the second node;

the second node control module is connected to a first clock signal terminal, the first node, the second node and the first level terminal, respectively, and configured to make the node voltage of the second node equal to either the voltage of a first clock signal inputted at the first clock signal terminal or the voltage of the first level terminal, under the control of the first clock signal and the node voltage of the first node;

the third node control module is connected to the first signal input terminal, a third signal input terminal, a third node and the first level terminal, respectively, and configured to make the node voltage of the third node equal to either the voltage of the first input signal inputted at the first signal input terminal or the voltage of the first level terminal, under the control of the first input signal and a third input signal inputted at the third signal input terminal;

the first output module is connected to a second clock signal terminal, the first node, the second node, the second signal input terminal, the first level terminal and a first signal output terminal, respectively, and configured to output at the first signal output terminal a second clock signal inputted at the second clock signal terminal or make the voltage of a first output signal at the first signal output terminal equal to the voltage of the first level terminal, under the control of the node voltage of the first node, the node voltage of the second node and the second input signal; and the second output module connected to the second clock signal terminal, the second node, the third node, the third signal input terminal, a second signal output terminal and the first level terminal, respectively, and configured to output at the second signal output terminal the second clock signal inputted at the second clock signal terminal or make the voltage of a second output signal at the second signal output terminal equal to the voltage of the first level terminal, under the control of the node voltage of the second node, the node voltage of the third node and the third input signal.

2. The GOA unit according to claim 1, wherein the first node control module comprises a first switching element, a second switching element and a third switching element, wherein a first electrode and a control electrode of the first switching element are coupled to the first signal input terminal, and a second electrode of the first switching element is coupled to the first node;

a first electrode of the second switching element is coupled to the first node, a second electrode of the second switching element is coupled to the first level terminal, and a control electrode of the second switching element is coupled to the second signal input terminal; and a first electrode of the third switching element is coupled to the first node, a second electrode of the third switching element is coupled to the first level terminal, and a control electrode of the third switching element is coupled to the second node.

3. The GOA unit according to claim 2, wherein each of the switching elements is a field effect transistor or a bipolar transistor.

4. The GOA unit according to claim 1, wherein the second node control module comprises a fourth switching element, a fifth switching element and a sixth switching element, wherein a first electrode of the fourth switching element is coupled to the first clock signal terminal, a second electrode of the fourth switching element is coupled to the second node, and a control electrode of the fourth switching element is coupled to a second electrode of the sixth switching element;

a first electrode of the fifth switching element is coupled to the second node, a second electrode of the fifth switching element is coupled to the first level terminal, and a control electrode of the fifth switching element is coupled to the first node; and a first electrode of the sixth switching element is coupled to the first clock signal terminal, and a control electrode of the sixth switching element is coupled to the first clock signal terminal.

5. The GOA unit according to claim 4, wherein each of the switching elements is a field effect transistor or a bipolar transistor.

6. The GOA unit according to claim 1, wherein the third node control module comprises a seventh switching element and an eighth switching element, wherein a first electrode of the seventh switching element is coupled to the first signal input terminal, a second electrode of the seventh switching element is coupled to the third node, and a control electrode of the seventh switching element is coupled to the first signal input terminal; and a first electrode of the eighth switching element is coupled to the third node, a second electrode of the eighth switching element is coupled to the first level terminal, and a control electrode of the eighth switching element is coupled to the third signal input terminal.

7. The GOA unit according to claim 6, wherein each of the switching elements is a field effect transistor or a bipolar transistor.

8. The GOA unit according to claim 1, wherein the first output module comprises a ninth switching element, a tenth switching element, an eleventh switching element and a first energy storage element, wherein a first electrode of the first energy storage element is coupled to the first node, a second electrode of the first energy storage element is coupled to the first signal output terminal;

a first electrode of the ninth switching element is coupled to the second clock signal terminal, a second electrode of the ninth switching element is coupled to the first signal output terminal, a control electrode of the ninth switching element is coupled to the first node;

a first electrode of the tenth switching element is coupled to the first signal output terminal, a second electrode of the tenth switching element is coupled to the first level terminal, and a control electrode of the tenth switching element is coupled to the second node; and a first electrode of the eleventh switching element is coupled to the first signal output terminal, a second electrode of the eleventh switching element is coupled to the first level terminal, and a control electrode of the eleventh switching element is coupled to the second signal input terminal.

9. The GOA unit according to claim 8, wherein each of the switching elements is a field effect transistor or a bipolar transistor, and the first energy storage element is a capacitor.

10. The GOA unit according to claim 1, wherein the second output module comprises a twelfth switching element, a thirteenth switching element, a fourteenth switching element and a second energy storage element,
  wherein a first electrode of the second energy storage element is coupled to the third node, and a second electrode of the second energy storage element is coupled to the second signal output terminal;
  a first electrode of the twelfth switching element is coupled to the second clock signal terminal, a second electrode of the twelfth switching element is coupled to the second signal output terminal, and a control electrode of the twelfth switching element is coupled to the third node;
  a first electrode of the thirteenth switching element is coupled to the second signal output terminal, a second electrode of the thirteenth switching element is coupled to the first level terminal, and a control electrode of the thirteenth switching element is coupled to the second node; and
  a first electrode of the fourteenth switching element is coupled to the second signal output terminal, a second electrode of the fourteenth switching element is coupled to the first level terminal, and a gate of the fourteenth switching element is coupled to the third signal input terminal.

11. The GOA unit according to claim 10, wherein each of the switching elements is a field effect transistor or a bipolar transistor, and the second energy storage element is a capacitor.

12. The GOA unit according to claim 1, wherein the first clock signal and the second clock signal have the same clock cycle and amplitude but opposite phases, and the first clock signal and the second clock signal both have a duty cycle of 50%.

13. A GOA circuit comprising a plurality of cascaded GOA units according to claim 1,
  wherein a first frame start signal is inputted to the first signal input terminal of a first-stage GOA unit, a second frame start signal is inputted to the first signal input terminal of a second-stage GOA unit, and a third frame start signal is inputted to the first signal input terminal of a third-stage GOA unit,
  the first signal output terminal of a Nth-stage GOA unit is coupled to the first signal input terminal of (N+3)th-stage GOA unit, the third signal input terminal of a (N−1)th-stage GOA unit, the second signal input terminal of a (N−3)th-stage GOA unit and a gate driving signal terminal of the Nth row of pixel units corresponding to the Nth-stage GOA unit, respectively; and
  the second signal output terminal of the Nth-stage GOA unit is coupled to a reset signal terminal of the Nth row of pixel units corresponding to the Nth-stage GOA unit, wherein N is a natural number.

14. The GOA circuit according to claim 13, wherein
the first node control module comprises a first switching element, a second switching element and a third switching element, a first electrode and a control electrode of the first switching element are coupled to the first signal input terminal, and a second electrode of the first switching element is coupled to the first node; a first electrode of the second switching element is coupled to the first node, a second electrode of the second switching element is coupled to the first level terminal, and a control electrode of the second switching element is coupled to the second signal input terminal; a first electrode of the third switching element is coupled to the first node, a second electrode of the third switching element is coupled to the first level terminal, and a control electrode of the third switching element is coupled to the second node;
the second node control module comprises a fourth switching element, a fifth switching element and a sixth switching element, wherein a first electrode of the fourth switching element is coupled to the first clock signal terminal, a second electrode of the fourth switching element is coupled to the second node, and a control electrode of the fourth switching element is coupled to a second electrode of the sixth switching element; a first electrode of the fifth switching element is coupled to the second node, a second electrode of the fifth switching element is coupled to the first level terminal, and a control electrode of the fifth switching element is coupled to the first node; a first electrode of the sixth switching element is coupled to the first clock signal terminal, and a control electrode of the sixth switching element is coupled to the first clock signal terminal;
the third node control module comprises a seventh switching element and an eighth switching element, a first electrode of the seventh switching element is coupled to the first signal input terminal, a second electrode of the seventh switching element is coupled to the third node, and a control electrode of the seventh switching element is coupled to the first signal input terminal; a first electrode of the eighth switching element is coupled to the third node, a second electrode of the eighth switching element is coupled to the first level terminal, and a control electrode of the eighth switching element is coupled to the third signal input terminal;
the first output module comprises a ninth switching element, a tenth switching element, an eleventh switching element and a first energy storage element, a first electrode of the first energy storage element is coupled to the first node, a second electrode of the first energy storage element is coupled to the first signal output terminal; a first electrode of the ninth switching element is coupled to the second clock signal terminal, a second electrode of the ninth switching element is coupled to the first signal output terminal, a control electrode of the ninth switching element is coupled to the first node; a first electrode of the tenth switching element is coupled to the first signal output terminal, a second electrode of the tenth switching element is coupled to the first level terminal, and a control electrode of the tenth switching element is coupled to the second node; a first electrode of the eleventh switching element is coupled to the first signal output terminal, a second electrode of the eleventh switching element is coupled to the first level terminal, and a control electrode of the eleventh switching element is coupled to the second signal input terminal;
the second output module comprises a twelfth switching element, a thirteenth switching element, a fourteenth switching element and a second energy storage element, a first electrode of the second energy storage element is coupled to the third node, and a second electrode of the second energy storage element is coupled to the second signal output terminal; a first electrode of the twelfth switching element is coupled to the second clock signal terminal, a second electrode of the twelfth switching element is coupled to the second signal output terminal, and a control electrode of the twelfth switching element is coupled to the third node; a first electrode of the thirteenth switching element is coupled to the second signal output terminal, a second electrode of the thirteenth switching element is coupled to the first level terminal, and a control electrode of the thirteenth switching element is coupled to the second node; a first electrode of the fourteenth switching element is coupled to the second signal output terminal, a second electrode of the fourteenth switching element is coupled to the first level terminal, and a gate of the fourteenth switching element is coupled to the third signal input terminal.

15. The GOA circuit according to claim 13, wherein
the first clock signal and the second clock signal of each stage GOA unit have the same clock cycle and amplitude but opposite phase, the first clock signal and the second clock signal of the Nth-stage GOA unit are identical with the second clock signal and the first clock signal of the (N+3)th-stage GOA unit respectively; the first clock signal of the second-stage GOA unit lags behind the first clock signal of the first-stage GOA unit by ⅙ clock period in phase, and the first clock signal of the third-stage GOA unit lags behind the first clock signal of the first-stage GOA unit by ⅓ clock period in phase.

16. A display driving circuit comprising a GOA circuit according to claim 13 and a pixel driving circuit.

17. The display driving circuit according to claim 16, wherein the pixel driving circuit is provided with a data signal terminal, a gate driving signal terminal, a reset signal terminal, a high level signal terminal and a low level signal terminal, wherein the gate driving signal terminal of the Nth row of pixel units is coupled to the first signal output terminal of the Nth stage GOA unit in the GOA circuit, the reset signal terminal of the Nth row of pixel units is coupled to the second signal output terminal of the Nth-stage GOA unit in the GOA circuit.

18. The display driving circuit according to claim 17, wherein the pixel driving circuit comprises a fifteenth switching element, a sixteenth driving element, a seventeenth switching element, a third energy storage element, a fourth energy storage element and an organic light-emitting diode,
   wherein, a first electrode of the fifteenth switching element is coupled to a data signal terminal, a second electrode of the fifteenth switching element is coupled to a first electrode of the third element storage element, and a control electrode of the fifteenth switching element is coupled to the gate driving signal terminal;
   a first electrode of the sixteenth driving element is coupled to the high level signal terminal, and a second electrode of the sixteenth driving element is coupled to a second electrode of the third energy storage element;
   a first electrode of the seventeenth switching element is coupled to the low level signal terminal, a second electrode of the seventeenth switching element is coupled to a first electrode of the fourth energy storage element, and a control element of the seventeenth switch is coupled to the reset signal terminal;
   an anode of the organic light emitting diode is coupled to the second electrode of the sixteenth driving element, and a cathode of the organic light emitting diode is grounded;
   a second electrode of the fourth energy storage element is grounded.

19. A display device comprising a display driving circuit according to claim 16, wherein
   the pixel driving circuit is provided with a data signal terminal, a gate driving signal terminal, a reset signal terminal, a high level signal terminal and a low level signal terminal, wherein the gate driving signal terminal of the Nth row of pixel unit is coupled to the first signal output terminal of the Nth stage GOA unit in the GOA circuit, the reset signal terminal of the Nth row of pixel units is coupled to the second signal output terminal of the Nth-stage GOA unit in the GOA circuit.

20. The display device according to claim 19, wherein
   the pixel driving circuit comprises a fifteenth switching element, a sixteenth driving element, a seventeenth switching element, a third energy storage element, a fourth energy storage element and an organic light-emitting diode,
   wherein, a first electrode of the fifteenth switching element is coupled to a data signal terminal, a second electrode of the fifteenth switching element is coupled to a first electrode of the third element storage element, and a control electrode of the fifteenth switching element is coupled to the gate driving signal terminal;
   a first electrode of the sixteenth driving element is coupled to the high level signal terminal, and a second electrode of the sixteenth driving element is coupled to a second electrode of the third energy storage element;
   a first electrode of the seventeenth switching element is coupled to the low level signal terminal, a second electrode of the seventeenth switching element is coupled to a first electrode of the fourth energy storage element, and a control element of the seventeenth switch is coupled to the reset signal terminal;
   an anode of the organic light emitting diode is coupled to the second electrode of the sixteenth driving element, and a cathode of the organic light emitting diode is grounded;
   a second electrode of the fourth energy storage element is grounded;
   the gate driving signal terminal of the Nth row of pixel units is coupled to the first signal output terminal of the Nth-stage GOA unit in the GOA circuit, and the reset signal terminal of the Nth row of pixel units is coupled to the second signal output terminal of the Nth-stage GOA unit in the GOA circuit.

* * * * *